(12) United States Patent
Lin et al.

(10) Patent No.: US 12,165,955 B2
(45) Date of Patent: Dec. 10, 2024

(54) SEMICONDUCTOR ARRANGEMENT AND METHOD FOR MAKING

(71) Applicant: Taiwan Semiconductor Manufacturing Company Limited, Hsin-Chu (TW)

(72) Inventors: Josh Lin, Tainan (TW); Chung-Jen Huang, Tainan (TW); Yun-Chi Wu, Tainan (TW); Tsung-Yu Yang, Tainan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 18/517,303

(22) Filed: Nov. 22, 2023

(65) Prior Publication Data
US 2024/0087989 A1    Mar. 14, 2024

Related U.S. Application Data

(60) Continuation of application No. 17/536,304, filed on Nov. 29, 2021, now Pat. No. 11,854,942, which is a division of application No. 16/656,986, filed on Oct. 18, 2019, now Pat. No. 11,189,546.

(51) Int. Cl.
*H01L 23/48* (2006.01)
*H01L 21/74* (2006.01)
*H01L 27/12* (2006.01)

(52) U.S. Cl.
CPC .......... *H01L 23/481* (2013.01); *H01L 21/743* (2013.01); *H01L 27/1203* (2013.01)

(58) Field of Classification Search
CPC . H01L 23/481; H01L 21/743; H01L 27/1203; H01L 23/535; H01L 21/76283
See application file for complete search history.

(56) References Cited

U.S. PATENT DOCUMENTS

| | | | |
|---|---|---|---|
| 6,399,486 B1 | 6/2002 | Chen et al. | |
| 2002/0113267 A1 | 8/2002 | Brown et al. | |
| 2008/0122025 A1 | 5/2008 | Roggenbauer et al. | |
| 2008/0132066 A1 | 6/2008 | Phan et al. | |
| 2011/0018094 A1 | 1/2011 | Chapman et al. | |
| 2011/0124177 A1 | 5/2011 | Botula et al. | |
| 2012/0104497 A1* | 5/2012 | Denison | H01L 29/7824 257/E21.409 |
| 2012/0267758 A1 | 10/2012 | Shroff et al. | |

(Continued)

FOREIGN PATENT DOCUMENTS

TW    200828496 A    7/2008

OTHER PUBLICATIONS

Office Action received in corresponding Chinese patent application No. 202011094327.1, dated Aug. 12, 2024, 34 pages.

*Primary Examiner* — Shih Tsun A Chou
(74) *Attorney, Agent, or Firm* — Cooper Legal Group, LLC

(57) ABSTRACT

A semiconductor arrangement includes a first dielectric feature passing through a semiconductive layer and a first dielectric layer over a substrate. The semiconductor arrangement includes a conductive feature passing through the semiconductive layer and the first dielectric layer and electrically coupled to the substrate. The conductive feature is adjacent the first dielectric feature and electrically isolated from the semiconductive layer by the first dielectric feature.

20 Claims, 7 Drawing Sheets

(56) References Cited

U.S. PATENT DOCUMENTS

| | | | |
|---|---|---|---|
| 2013/0189825 A1 | 7/2013 | Le Tiec et al. | |
| 2013/0285125 A1 | 10/2013 | Chen et al. | |
| 2015/0348870 A1 | 12/2015 | Feilchenfeld et al. | |
| 2019/0252390 A1* | 8/2019 | Chen | H10B 12/485 |

* cited by examiner

SEMICONDUCTOR ARRANGEMENT AND METHOD FOR MAKING

RELATED APPLICATIONS

This application is a continuation of and claims priority to U.S. patent application Ser. No. 17/536,304, titled "SEMICONDUCTOR ARRANGEMENT AND METHOD FOR MAKING" and filed on Nov. 29, 2021, which is a divisional of and claims priority to U.S. patent application Ser. No. 16/656,986, titled "SEMICONDUCTOR ARRANGEMENT AND METHOD FOR MAKING" and filed on Oct. 18, 2019. U.S. patent application Ser. Nos. 17/536,304 and 16/656,986 are incorporated herein by reference.

BACKGROUND

During semiconductor fabrication, various layers are formed and processed, such as by etching, to establish semiconductor arrangements that have one or more features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
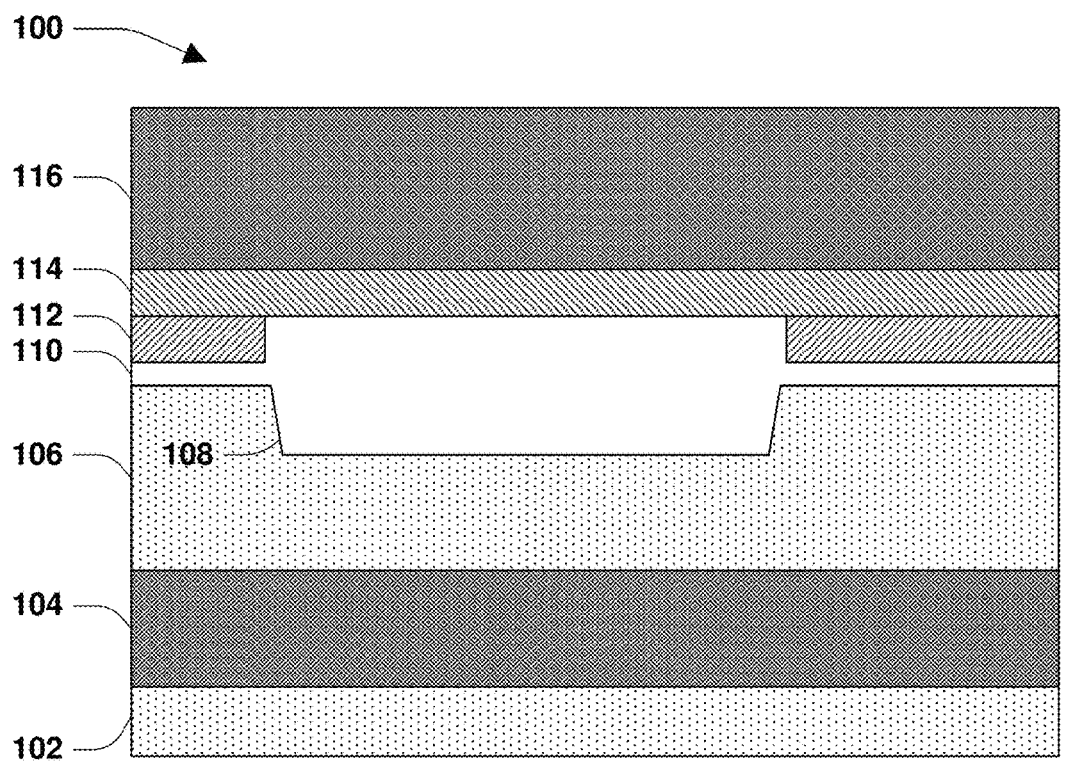
FIGS. 1-12 illustrate a semiconductor arrangement at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments relate to a semiconductor arrangement that includes a first dielectric feature that passes through a semiconductive layer and a first dielectric layer under the semiconductive layer. In some embodiments, the semiconductor arrangement includes a conductive feature that passes through the semiconductive layer and the first dielectric layer and electrically couples to a substrate under the first dielectric layer. In some embodiments, the conductive feature is adjacent the first dielectric feature and is electrically isolated from the semiconductive layer by the first dielectric feature.

According to some embodiments, the semiconductor arrangement includes a second dielectric feature passing through the semiconductive layer and the first dielectric layer. In some embodiments, the conductive feature is adjacent the second dielectric feature and is electrically isolated from the semiconductive layer by the second dielectric feature. In some embodiments, the conductive feature is between the first dielectric feature and the second dielectric feature.

According to some embodiments, one or more semiconductor arrangements are used for conduction through various layers, such as for electrically coupling to a substrate, while one or more semiconductor arrangements are used for isolation, separation, spacing, etc. According to some embodiments, a first semiconductor arrangement is between an active region and a second semiconductor arrangement. According to some embodiments, the active region is part of a transistor. According to some embodiments, the first semiconductor arrangement between the active region and the second semiconductor arrangement serves to isolate, separate, space, etc. the second semiconductor arrangement from the active region. According to some embodiments, such isolation, separation, spacing, etc. inhibits unintended effects of the second semiconductor arrangement on the active region or vice versa.

FIG. 1 illustrates a semiconductor arrangement 100 according to some embodiments. In some embodiments, the semiconductor arrangement 100 includes a substrate 102, a first dielectric layer 104, a semiconductive layer 106, a shallow trench isolation (STI) region 108, an STI extension layer 110, a second dielectric layer 112, a third dielectric layer 114, and a fourth dielectric layer 116. In some embodiments, the substrate 102 functions as a foundation, base, or table to hold various layers during fabrication. According to some embodiments, the substrate 102 is made of glass. In some embodiments, the substrate 102 is transparent to light. In some embodiments, the substrate 102 is transparent to light at ultraviolet (UV) wavelengths. In some embodiments, the substrate 102 is a p-type semiconductor substrate (P-substrate). In some embodiments, the substrate 102 is an n-type semiconductor substrate (N-substrate). In some embodiments, the substrate 102 comprises at least one of silicon, germanium, carbide, arsenide, gallium, arsenic, phosphide, indium, antimonide, SiGe, SiC, GaAs, GaP, InP, InAs, InSb, GaAsP, AlInAs, AlGaAs, GaInAs, GaInP, GaInAsP, or other suitable materials. In some embodiments, the substrate 102 comprises at least one doped region. According to some embodiments, the substrate 102 comprises at least one of an epitaxial layer, a silicon-on-insulator (SOI) structure, a wafer, or a die formed from a wafer.

The first dielectric layer 104 is formed over the substrate 102, according to some embodiments. In some embodiments, the first dielectric layer 104 is in contact with a top surface of the substrate 102. In some embodiments, the first dielectric layer 104 is a bottom oxide (BOX). In some embodiments, the first dielectric layer 104 comprises at least one of silicon, oxide, nitride, such as SiN, or other suitable materials. In some embodiments, the first dielectric layer 104 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques. In some embodiments, the first dielectric layer 104 is at least 0.3 micrometers thick.

The semiconductive layer 106 is formed over the first dielectric layer 104, according to some embodiments. In some embodiments, the semiconductive layer 106 is in contact with a top surface of the first dielectric layer 104. In some embodiments, the semiconductive layer 106 comprises at least one of silicon, germanium, carbide, arsenide, gallium, arsenic, phosphide, indium, antimonide, SiGe, SiC, GaAs, GaP, InP, InAs, InSb, GaAsP, AlInAs, AlGaAs, GaInAs, GaInP, GaInAsP, or other suitable materials. In some embodiments, the semiconductive layer 106 is a silicon-on-insulator (SOI) structure. In some embodiments, the semiconductive layer 106 is formed by at least one of PVD, sputtering, CVD, LPCVD, ALCVD, UHVCVD, RPCVD, ALD, MBE, LPE, spin on, growth, or other suitable techniques. In some embodiments, the semiconductive layer 106 is at least 5 micrometers thick.

The STI region 108 is formed over the semiconductive layer 106, according to some embodiments. In some embodiments, the STI region 108 is in contact with a top surface of the semiconductive layer 106. In some embodiments, the STI region 108 comprises at least one of silicon, oxide, nitride, such as SiN, or other suitable materials. In some embodiments, the STI region 108 is formed at least partially within the semiconductive layer 106. In some embodiments, a recess is formed, such as etched, in the semiconductive layer 106 and the STI region 108 is formed in the recess. In some embodiments, the STI region 108 is formed by at least one of PVD, sputtering, CVD, LPCVD, ALCVD, UHVCVD, RPCVD, ALD, MBE, LPE, spin on, growth, or other suitable techniques. In some embodiments, the STI region 108 is at least 0.2 micrometers thick.

The STI extension layer 110 is formed over the semiconductive layer 106, according to some embodiments. In some embodiments, the STI extension layer 110 is in contact with a top surface of the semiconductive layer 106. In some embodiments, the STI extension layer 110 comprises at least one of silicon, oxide, nitride, such as SiN, or other suitable materials. In some embodiments, the STI extension layer 110 is formed concurrently with formation of the STI region 108. In some embodiments, the STI extension layer 110 is formed by at least one of PVD, sputtering, CVD, LPCVD, ALCVD, UHVCVD, RPCVD, ALD, MBE, LPE, spin on, growth, or other suitable techniques. In some embodiments, the STI extension layer 110 is at least 0.01 micrometers thick.

The second dielectric layer 112 is formed over the STI extension layer 110, according to some embodiments. In some embodiments, the second dielectric layer 112 is in contact with a top surface of the STI extension layer 110. In some embodiments, the second dielectric layer 112 comprises at least one of silicon, oxide, nitride, such as SiN, or other suitable materials. In some embodiments, the second dielectric layer 112 is formed by at least one of PVD, sputtering, CVD, LPCVD, ALCVD, UHVCVD, RPCVD, ALD, MBE, LPE, spin on, growth, or other suitable techniques. In some embodiments, the second dielectric layer 112 is at least 0.06 micrometers thick. In some embodiments, the STI region 108 extends above the semiconductive layer 106 such that a portion of a sidewall of the STI region abuts a sidewall of the second dielectric layer 112. In some embodiments, the second dielectric layer 112 has a same composition as the first dielectric layer 104. In some embodiments, the second dielectric layer 112 does not have a same composition as the first dielectric layer 104. In some embodiments, the second dielectric layer 112 is formed in a same manner as the first dielectric layer 104. In some embodiments, the second dielectric layer 112 is not formed in a same manner as the first dielectric layer 104.

The third dielectric layer 114 is formed over at least one of the second dielectric layer 112 or the STI region 108, according to some embodiments. In some embodiments, the third dielectric layer 114 is in contact with at least one of a top surface of the second dielectric layer 112 or a top surface of the STI region 108. In some embodiments, the third dielectric layer 114 comprises at least one of silicon, oxide, nitride, such as SiN, or other suitable materials. In some embodiments, the third dielectric layer 114 is formed by at least one of PVD, sputtering, CVD, LPCVD, ALCVD, UHVCVD, RPCVD, ALD, MBE, LPE, spin on, growth, or other suitable techniques. In some embodiments, the third dielectric layer 114 is at least 0.12 micrometers thick. In some embodiments, the third dielectric layer 114 has a same composition as at least one of the first dielectric layer 104 or the second dielectric layer 112. In some embodiments, the third dielectric layer 114 does not have a same composition as at least one of the first dielectric layer 104 or the second dielectric layer 112. In some embodiments, the third dielectric layer 114 is formed in a same manner as at least one of the first dielectric layer 104 or the second dielectric layer 112. In some embodiments, the third dielectric layer 114 is not formed in a same manner as at least one of the first dielectric layer 104 or the second dielectric layer 112.

The fourth dielectric layer 116 is formed over the third dielectric layer 114, according to some embodiments. In some embodiments, the fourth dielectric layer 116 is in contact with a top surface of the third dielectric layer 114. In some embodiments, the fourth dielectric layer 116 comprises at least one of silicon, oxide, nitride, such as SiN, or other suitable materials. In some embodiments, the fourth dielectric layer 116 is formed by at least one of PVD, sputtering, CVD, LPCVD, ALCVD, UHVCVD, RPCVD, ALD, MBE, LPE, spin on, growth, or other suitable techniques. In some embodiments, the fourth dielectric layer 116 is at least 0.7 micrometers thick. In some embodiments, the fourth dielectric layer 116 has a same composition as at least one of the first dielectric layer 104, the second dielectric layer 112, or the third dielectric layer 114. In some embodiments, the fourth dielectric layer 116 does not have a same composition as at least one of the first dielectric layer 104, the second dielectric layer 112, or the third dielectric layer 114. In some embodiments, the fourth dielectric layer 116 is formed in a same manner as at least one of the first dielectric layer 104, the second dielectric layer 112, or the third dielectric layer 114. In some embodiments, the fourth dielectric layer 116 is not formed in a same manner as at least one of the first dielectric layer 104, the second dielectric layer 112, or the third dielectric layer 114.

Figure 2:
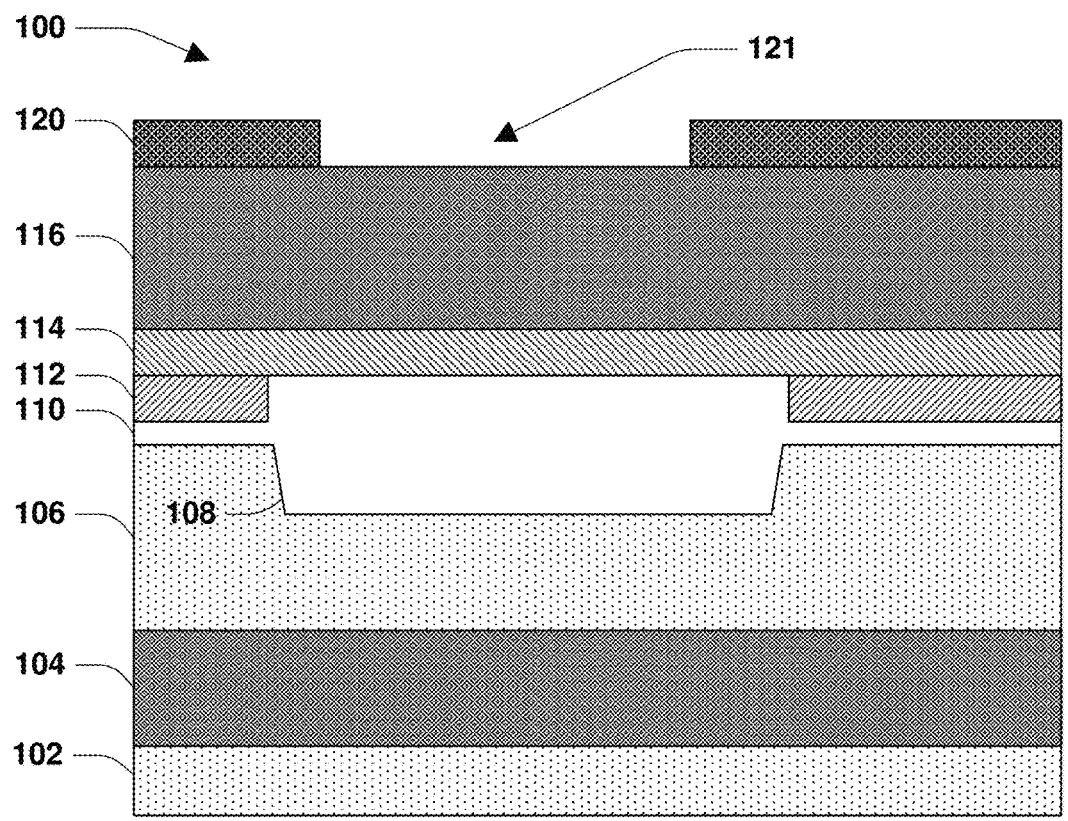

FIG. 2 illustrates a photoresist 120 formed over the fourth dielectric layer 116 and patterned to have an opening 121, according to some embodiments. In some embodiments, the photoresist 120 is formed by at least one of PVD, sputtering, CVD, LPCVD, ALCVD, UHVCVD, RPCVD, ALD, MBE, LPE, spin on, growth, or other suitable techniques. In some embodiments, the photoresist 120 comprises a light-sensitive material, where properties, such as solubility, of the photoresist 120 are affected by light. The photoresist 120 is either a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. According to some embodiments, one or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer. In some embodiments, the photoresist 120 is at least 0.01 micrometers thick.

Figure 3:
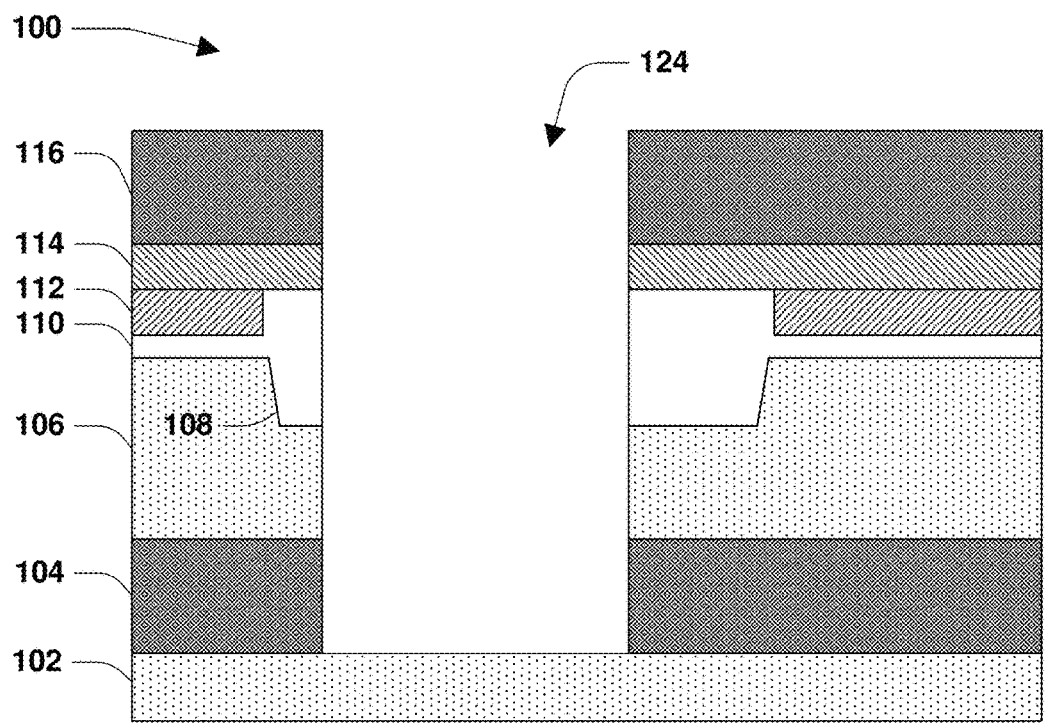

FIG. 3 illustrates use of the patterned photoresist 120 to remove portions of the fourth dielectric layer 116, the third dielectric layer 114, the STI region 108, the semiconductive layer 106, and the first dielectric layer 104, to form an opening 124 and expose the substrate, according to some embodiments. In some embodiments, an etching process is performed to form the opening 124, where the opening 121 in the photoresist 120 allows one or more etchants applied during the etching process to remove the aforesaid portions of the various layers or stack down to the substrate 102 while the rest of the photoresist 120 protects or shields the portions of the various layers or stack that are covered by the photoresist 120. According to some embodiments, the etching process is a dry etching process. According to some embodiments, the etching process uses at least one of hydrogen chloride ($HCl_2$), hydrogen sulfide ($H_2S$), or other suitable materials. According to some embodiments, the patterned photoresist 120 is removed after the opening 124 is formed. According to some embodiments, the patterned photoresist 120 is removed after one or more layers, elements, features, etc. are formed in the opening 124. In some embodiments, the thickness of the fourth dielectric layer 116 is reduced, such as from about 0.9 micrometers to about 0.54 micrometers, when the opening 124 is formed. According to some embodiments, the thickness of the fourth dielectric layer 116 is reduced when the patterned photoresist 120 is removed. According to some embodiments, the patterned photoresist 120 is removed after the fourth dielectric layer 116 is patterned but before all of the third dielectric layer 114, the STI region 108, the semiconductive layer 106, and the first dielectric layer 104 are removed such that the thickness of the fourth dielectric layer 116 is reduced as at least one of the third dielectric layer 114, the STI region 108, the semiconductive layer 106, or the first dielectric layer 104 are removed. According to some embodiments, a single template, such as a mask, is used to form the opening 124.

Figure 4:
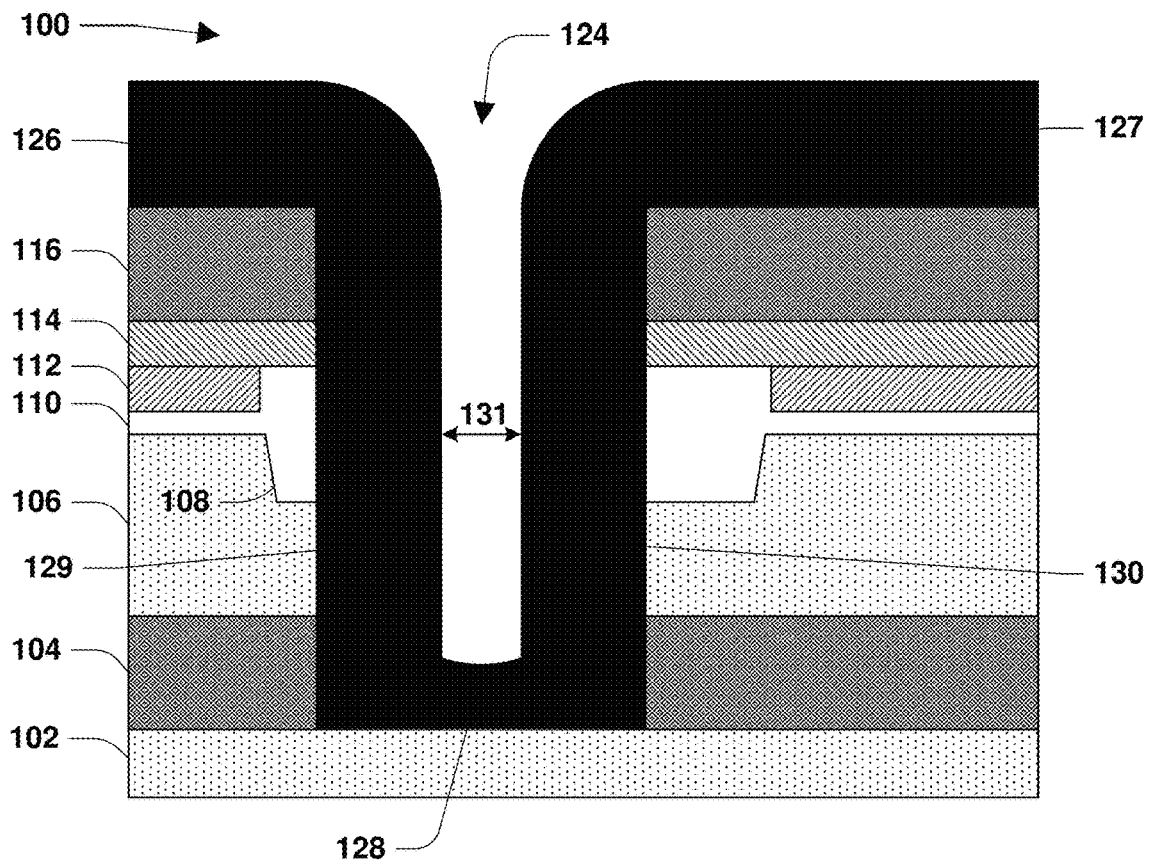

FIG. 4 illustrates a layer of dielectric material 126 formed in the opening 124, according to some embodiments. In some embodiments, the layer of dielectric material 126 is formed over, such as in contact with, the fourth dielectric layer 116, the substrate 102, and sidewalls of one or more layers, regions, etc. defining the opening 124. In some embodiments, a first portion 127 of the layer of dielectric material 126 is formed over the fourth dielectric layer 116. In some embodiments, a second portion 128 of the layer of dielectric material 126 is formed over the substrate 102. In some embodiments, a third portion 129 of the layer of dielectric material 126 is formed on the left side of the opening 124 over sidewalls of one or more layers, regions, etc. defining the opening 124. In some embodiments, a fourth portion 130 of the layer of dielectric material 126 is formed on the right side of the opening 124 over sidewalls of one or more layers, regions, etc. defining the opening 124. In some embodiments, the layer of dielectric material 126 comprises at least one of HARP, TEOS, HDP, HTO, SiN, USG, Lining OX, or other suitable materials. In some embodiments, the layer of dielectric material 126 is formed by at least one of PVD, sputtering, CVD, LPCVD, ALCVD, UHVCVD, RPCVD, ALD, MBE, LPE, spin on, growth, or other suitable techniques. In some embodiments, the layer of dielectric material 126 is at least 0.5 micrometers thick. According to some embodiments, the layer of dielectric material 126 comprises one or more layers. According to some embodiments, at least some of the one or more layers are formed concurrently. According to some embodiments, at least some of the one or more layers are not formed concurrently. According to some embodiments, at least some of the one or more layers are formed in a same manner. According to some embodiments, at least some of the one or more layers are not formed in a same manner. In some embodiments, the layers of the layer of dielectric material 126 comprise at least one of HTO/SiN/HTO, TEOS/SiN/HTO, HARP/SiN/TEOS, Lining OX/SiN, Lining OX/SiN/HARP, Lining OX/SiN/HTO, Lining OX/HDP, Lining OX/USG, Lining OX/SiN/USG, USG/SiN, USG/SiN/USG, or other suitable combinations of layers. According to some embodiments, a distance 131 between the third portion 129 of the layer of dielectric material 126 and the fourth portion 130 of the layer of dielectric material 126 is about 0.4 micrometers.

Figure 5:
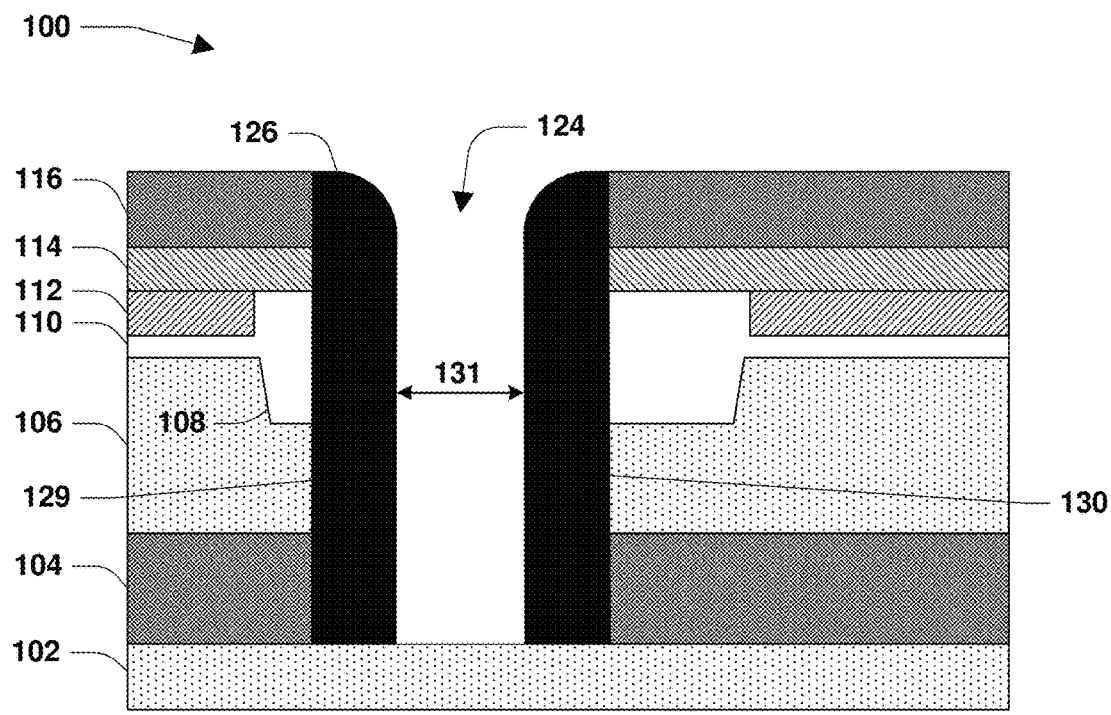

FIG. 5 illustrates removal of the first portion 127 of the layer of dielectric material 126 and the second portion 128 of the layer of dielectric material 126, according to some embodiments. In some embodiments, at least one of the first portion 127 of the layer of dielectric material 126 or the second portion 128 of the layer of dielectric material 126 is removed by at least one of etching, chemical mechanical polishing (CMP), or other suitable techniques. In some embodiments, the first portion 127 of the layer of dielectric material 126 and the second portion 128 of the layer of dielectric material 126 are removed concurrently. In some embodiments, the first portion 127 of the layer of dielectric material 126 and the second portion 128 of the layer of dielectric material 126 are not removed concurrently. In some embodiments, the first portion 127 of the layer of dielectric material 126 and the second portion 128 of the layer of dielectric material 126 are removed in a same manner. In some embodiments, the first portion 127 of the layer of dielectric material 126 and the second portion 128 of the layer of dielectric material 126 are not removed in a same manner. In some embodiments, some of the fourth dielectric layer 116 is removed when at least one of the first portion 127 of the layer of dielectric material 126 or the second portion 128 of the layer of dielectric material 126 is removed such that the thickness of the fourth dielectric layer 116 is reduced, such as from about 0.54 micrometers to about 0.4 micrometers. According to some embodiments, the thickness of at least one of the third portion 129 of the layer of dielectric material 126 or the fourth portion 130 of the layer of dielectric material 126 is reduced when at least one of the first portion 127 of the layer of dielectric material 126 or the second portion 128 of the layer of dielectric material 126 is removed such that the distance 131 between the third portion 129 of the layer of dielectric material 126 and the fourth portion 130 of the layer of dielectric material 126 is increased, such as from about 0.4 micrometers to about 0.46 micrometers.

Figure 6:
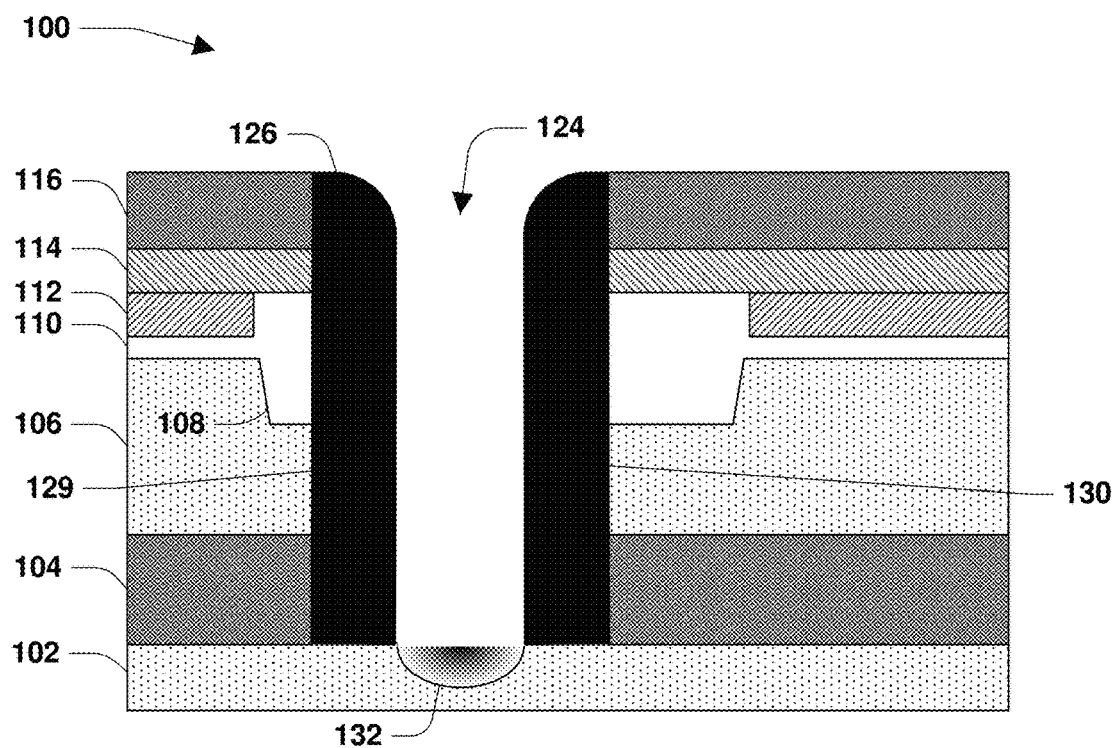

FIG. 6 illustrates a doped region 132 formed in the substrate 102, according to some embodiments. In some embodiments, the doped region 132 is aligned between the third portion 129 of the layer of dielectric material 126 and the fourth portion 130 of the layer of dielectric material 126. In some embodiments, the doped region 132 is formed by at least one of ion implantation, molecular diffusion, or other suitable techniques. In some embodiments, a depth of dopants in the substrate is controlled by increasing or decreasing a voltage used to direct the dopants into the substrate 102. In some embodiments, the doped region 132 has a gradient such that a concentration of dopants changes, such as increases or decreases, as the doped region 132 extends into the substrate 102. In some embodiments, the doped region 132 comprises p-type dopants. In some embodiments, the doped region 132 comprises n-type dopants.

Figure 7:
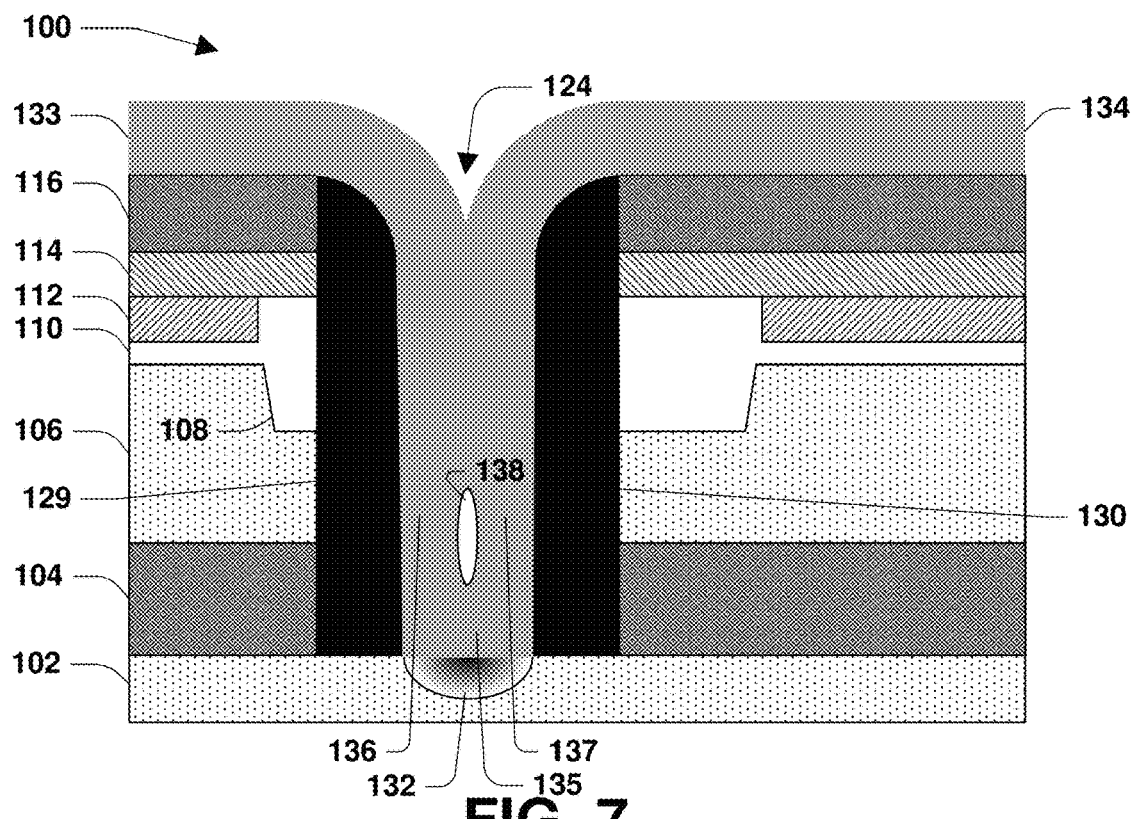

FIG. 7 illustrates a layer of conductive material 133 formed in the opening 124, according to some embodiments. In some embodiments, the layer of conductive material 133 is formed over, such as in contact with, the fourth dielectric layer 116, the third portion 129 of the layer of dielectric material 126, the fourth portion 130 of the layer of dielectric material 126, and the doped region 132 of the substrate 102. In some embodiments, a first portion 134 of the layer of conductive material 133 is formed over the fourth dielectric layer 116. In some embodiments, a second portion 135 of the layer of conductive material 133 is formed over the doped region 132. In some embodiments, a third portion 136 of the layer of conductive material 133 is formed on the left side of the opening 124 over the third portion 129 of the layer of dielectric material 126. In some embodiments, a fourth portion 137 of the layer of conductive material 133 is formed on the right side of the opening 124 over the fourth portion 130 of the layer of dielectric material 126. According to some embodiments, the layer of conductive material 133 comprises at least one of silicon, cobalt, tungsten, titanium, tantalum, such as tantalum nitride (TaN), or other suitable materials. In some embodiments, the layer of conductive material 133 is formed by at least one of PVD, sputtering, CVD, LPCVD, ALCVD, UHVCVD, RPCVD, ALD, MBE, LPE, spin on, growth, or other suitable techniques. In some embodiments, the layer of conductive material 133 is formed using a seed layer over at least one of the fourth dielectric layer 116, the third portion 129 of the layer of dielectric material 126, the fourth portion 130 of the layer of dielectric material 126, or the doped region 132 of the substrate 102. In some embodiments, the seed layer comprises at least one of copper, titanium, or other suitable materials. In some embodiments, the seed layer facilitates growing the layer of conductive material 133. In some embodiments, the layer of conductive material 133 is at least 0.2 micrometers thick. In some embodiments, a gap 138, such as comprising air, is between or defined by the third portion 136 of the layer of conductive material 133 and the fourth portion 137 of the layer of conductive material 133. In some embodiments, the gap 138 results from a relatively high aspect ratio of the opening 124 such that the layer of conductive material 133 pinches off or seals off the opening 124 nearer the fourth dielectric layer 116 before filling the opening 124 nearer the doped region 132.

Figure 8:
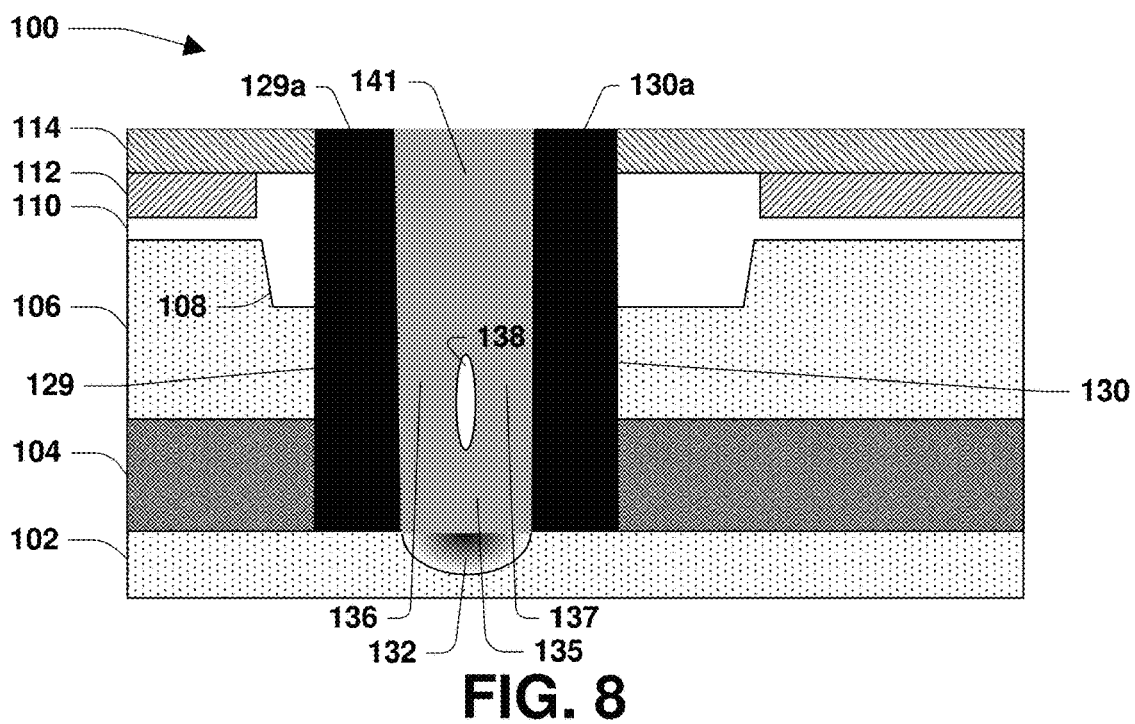

FIG. 8 illustrates removal of the first portion 134 of the layer of conductive material 133 and the fourth dielectric layer 116, according to some embodiments. In some embodiments, at least one of the first portion 134 of the layer of conductive material 133 or the fourth dielectric layer 116 is removed by at least one of etching, chemical mechanical polishing (CMP), or other suitable techniques. In some embodiments, the first portion 134 of the layer of conductive material 133 and the fourth dielectric layer 116 are removed concurrently. In some embodiments, the first portion 134 of the layer of conductive material 133 and the fourth dielectric layer 116 are not removed concurrently. In some embodiments, the first portion 134 of the layer of conductive material 133 and the fourth dielectric layer 116 are removed in a same manner. In some embodiments, the first portion 134 of the layer of conductive material 133 and the fourth dielectric layer 116 are not removed in a same manner. In some embodiments, some of the third dielectric layer 114 is removed when at least one of the first portion 134 of the layer of conductive material 133 or the fourth dielectric layer 116 is removed such that the thickness of the third dielectric layer 114 is reduced, such as from about 0.16 micrometers to about 0.14 micrometers. According to some embodiments, at least one of some of the third portion 129 of the layer of dielectric material 126, some of the fourth portion 130 of the layer of dielectric material 126, some of the third portion 136 of the layer of conductive material 133, or some of the fourth portion 137 of the layer of conductive material 133 is removed when at least one of the first portion 134 of the layer of conductive material 133 or the fourth dielectric layer 116 is removed. According to some embodiments, at least one of an uppermost surface of the third portion 129 of the layer of dielectric material 126, an uppermost surface of the fourth portion 130 of the layer of dielectric material 126, an uppermost surface of the third portion 136 of the layer of conductive material 133, or an uppermost surface of the fourth portion 137 of the layer of conductive material 133 is made substantially planar when at least one of the first portion 134 of the layer of conductive material 133 or the fourth dielectric layer 116 is removed. According to some embodiments, at least two of the uppermost surface of the third portion 129 of the layer of dielectric material 126, the uppermost surface of the fourth portion 130 of the layer of dielectric material 126, the uppermost surface of the third portion 136 of the layer of conductive material 133, or the uppermost surface of the fourth portion 137 of the layer of conductive material 133 are made substantially coplanar when at least one of the first portion 134 of the layer of conductive material 133 or the fourth dielectric layer 116 is removed.

According to some embodiments, the third portion 136 of the layer of conductive material 133 and the fourth portion 137 of the layer of conductive material 133 constitute a conductive feature 141 that establishes an electrically conductive pathway to the substrate 102, such as to the doped region 132 in the substrate 102. According to some embodiments, the third portion 129 of the layer of dielectric material 126 constitutes a first dielectric feature 129a that electrically isolates the conductive feature 141 from the semiconductive layer 106. According to some embodiments, the fourth portion 137 of the layer of dielectric material 126 constitutes a second dielectric feature 130a that electrically isolates the conductive feature 141 from the semiconductive layer 106. According to some embodiments, at least one of the first dielectric feature 129a or the second dielectric feature 130a is adjacent, such as in contact with, at least one of the conductive feature 141 or the semiconductive layer 106.

Figure 9:
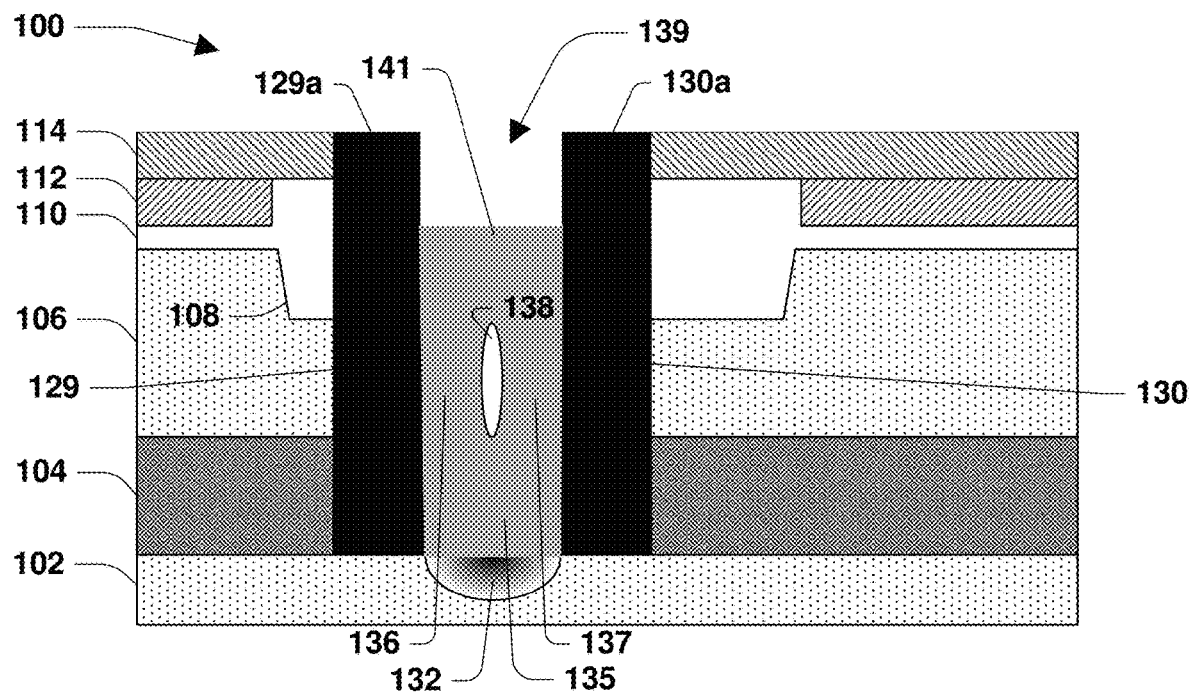

FIG. 9 illustrates removal of a portion of the conductive feature 141 to form a recess 139 between the first dielectric feature 129a and the second dielectric feature 130a, according to some embodiments. In some embodiments, an etching process is performed to form the recess 139. According to some embodiments, the etching process is a wet etching process. According to some embodiments, the etching process is a dry etching process. According to some embodiments, the etching process uses at least one of hydrogen chloride ($HCl_2$), hydrogen sulfide ($H_2S$), or other suitable materials. According to some embodiments, the recess 139 is formed such that an uppermost surface of the conductive feature 141 is above an uppermost surface of the semiconductive layer 106. According to some embodiments, the recess 139 is formed such that the uppermost surface of the conductive feature 141 is below the uppermost surface of the semiconductive layer 106. According to some embodiments, the recess 139 is formed such that the uppermost surface of the conductive feature 141 is substantially coplanar with the uppermost surface of the semiconductive layer 106.

Figure 10:
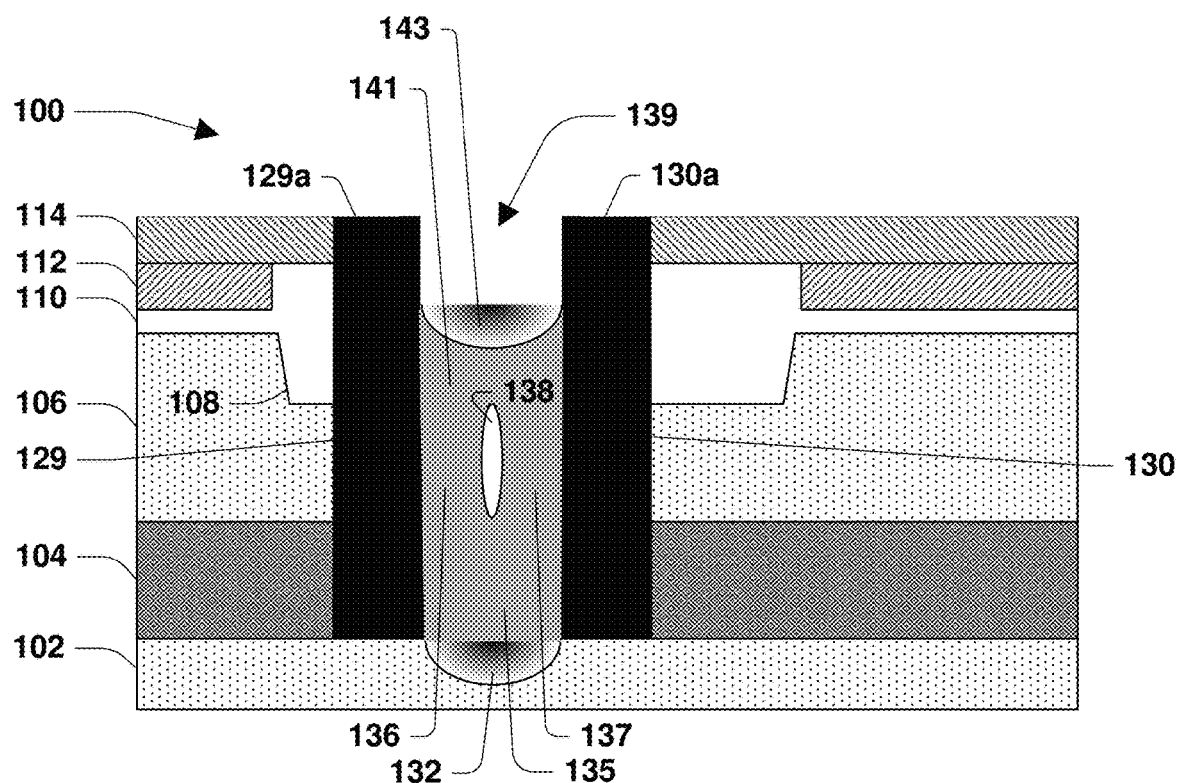

FIG. 10 illustrates a doped region 143 formed in the conductive feature 141, according to some embodiments. In some embodiments, the doped region 143 is aligned between the first dielectric feature 129a and the second dielectric feature 130a. In some embodiments, the doped region 143 is formed by at least one of ion implantation, molecular diffusion, or other suitable techniques. In some embodiments, a depth of dopants in the conductive feature 141 is controlled by increasing or decreasing a voltage used to direct the dopants into the conductive feature 141. In some embodiments, the doped region 143 is above the gap 138. In some embodiments, the doped region 143 extends below the gap 138. In some embodiments, the doped region 143 has a gradient such that a concentration of dopants changes, such as increases or decreases, as the doped region 143 extends into the conductive feature 141. In some embodiments, the doped region 143 comprises p-type dopants. In some embodiments, the doped region 143 comprises n-type dopants.

Figure 11:
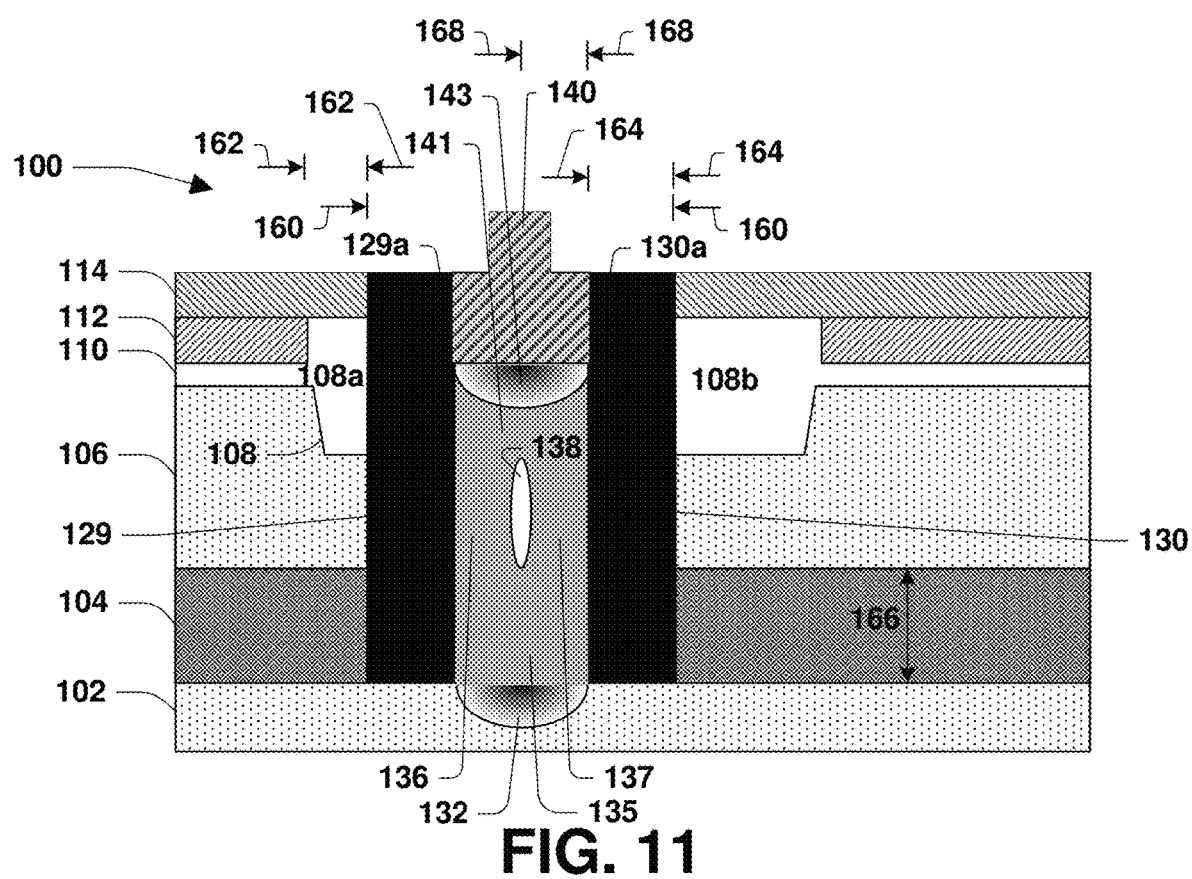

FIG. 11 illustrates a conductive contact 140 formed in the recess 139, according to some embodiments. In some embodiments, the conductive contact 140 comprises at least one of copper, tungsten, or other suitable materials. In some embodiments, the conductive contact 140 provides a mechanism to access the electrically conductive pathway afforded by the conductive feature 141. In some embodiments, the conductive contact 140 is formed by at least one of PVD, sputtering, CVD, LPCVD, ALCVD, UHVCVD, RPCVD, ALD, MBE, LPE, spin on, growth, or other suitable techniques. According to some embodiments, a ratio of a distance 160 between STI portions 108a, 108b to, such as divided by, a width 162 of one of the STI portions 108a or 108b is about 7 to 14. According to some embodiments, a ratio of a width 164 of one of the first dielectric feature 129a or the second dielectric feature 130a to, such as divided by, the thickness 166 of the first dielectric layer 104 is about 1.5 to 3. According to some embodiments, a ratio of the width 164 of one of the first dielectric feature 129a or the second dielectric feature 130a to, such as divided by, the distance 160 between STI portions 108a, 108b is about 0.4 to 0.8. According to some embodiments, the distance 160 between STI portions 108a, 108b is equal to 2 times the width 164 of one of the first dielectric feature 129a or the second dielectric feature 130a plus 2 times a width 168 of one of the third portion 136 of the layer of conductive material 133 or the fourth portion 137 of the layer of conductive material 133.

Figure 12:
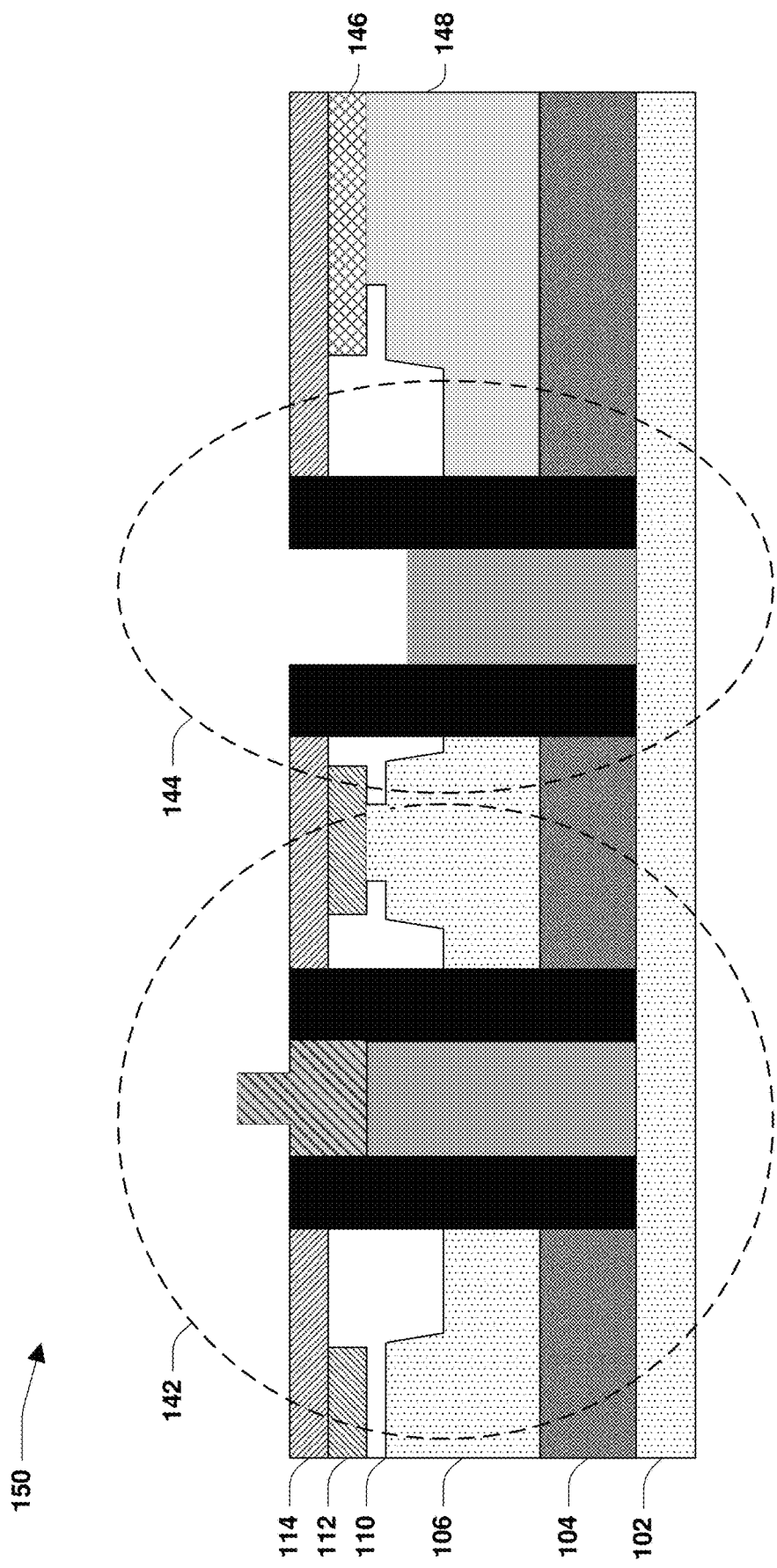

FIG. 12 illustrates a semiconductor arrangement 150 comprising multiple semiconductor arrangements, according to some embodiments, such as semiconductor arrangement 142 and semiconductor arrangement 144. In some embodiments, semiconductor arrangement 144 is similar to semiconductor arrangement 100 of FIG. 9. In some embodiments, semiconductor arrangement 142 is similar to semiconductor arrangement 100 of FIG. 11. According to some embodiments, any number of semiconductor arrangements are contemplated. According to some embodiments, one or more semiconductor arrangements, such as semiconductor arrangement 142, are used for conduction through various layers, such as electrically coupling to the substrate 102, while one or more semiconductor arrangements, such as semiconductor arrangement 144, are used for isolation, separation, spacing, etc. According to some embodiments, semiconductor arrangement 144 isolates, separates, spaces, etc. semiconductor arrangement 142 from an active region. According to some embodiments, the active region comprises at least one of a doped region 146 or a semiconductive region 148. According to some embodiments, the semiconductive region 148 is a doped well region, such as a 5 volt n-well (5 VNW). According to some embodiments, the active region is part of a transistor. In some embodiments, the doped region 146 is N+ doped. In some embodiments, the doped region 146 is P+ doped. According to some embodiments, such isolation, separation, spacing, etc. inhibits unintended effects of the semiconductor arrangement 142 on at least one of the doped region 146 or the semiconductive region 148 or vice versa. According to some embodiments, an unintended effect results from a magnetic field generated when current flows through the conductive feature 141 to the substrate 102. According to some embodiments, an unintended effect corresponds to cross talk between the semiconductor arrangement 142 and at least one of the doped region 146 or the semiconductive region 148.

According to some embodiments, a semiconductor arrangement includes a first dielectric feature passing through a semiconductive layer and a first dielectric layer over a substrate, and a conductive feature passing through the semiconductive layer and the first dielectric layer and electrically coupled to the substrate, the conductive feature adjacent the first dielectric feature and electrically isolated from the semiconductive layer by the first dielectric feature.

According to some embodiments, a method of forming a semiconductor arrangement includes forming a layer of dielectric material in a first opening in a stack, and forming a layer of conductive material in a second opening in the layer of dielectric material, wherein the layer of conductive material establishes an electrically conductive pathway through the stack to a substrate underlying the stack.

According to some embodiments, a method of forming a semiconductor arrangement includes forming a first opening in a first dielectric layer over a substrate and in a semiconductive layer over the first dielectric layer, forming a first dielectric feature in the first opening adjacent a sidewall of the first dielectric layer and a sidewall of the semiconductive layer, and forming a conductive feature in the first opening adjacent a sidewall of the first dielectric feature, the conductive feature electrically coupled to the substrate and electrically isolated from the semiconductive layer by the first dielectric feature.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, comprising:
   forming a first opening in a first dielectric layer over a substrate and in a semiconductive layer over the first dielectric layer;
   forming a first dielectric feature in the first opening adjacent a sidewall of the first dielectric layer and a sidewall of the semiconductive layer;
   forming a conductive feature in the first opening adjacent a sidewall of the first dielectric feature, the conductive feature electrically coupled to the substrate and electrically isolated from the semiconductive layer by the first dielectric feature; and
   doping a portion of the conductive feature above a gap in the conductive feature.

2. The method of claim 1, comprising:
   doping a portion of the substrate exposed through the first opening prior to forming the conductive feature.

3. The method of claim 2, wherein doping the portion of the substrate comprises doping the portion of the substrate after forming the first dielectric feature.

4. The method of claim 1, wherein forming the first opening comprises forming the first opening in a shallow trench isolation (STI) region.

5. The method of claim 1, comprising:
   recessing the conductive feature prior to doping the portion of the conductive feature above the gap in the conductive feature.

6. The method of claim 5, wherein recessing the conductive feature comprises recessing the conductive feature to expose a portion of the sidewall of the first dielectric feature.

7. The method of claim 1, comprising:
   forming a shallow trench isolation (STI) region over the semiconductive layer prior to forming the first opening, wherein forming the first dielectric feature comprises forming the first dielectric feature adjacent a sidewall of the STI region.

8. The method of claim 1, comprising:
   forming a conductive contact after doping the portion of the conductive feature above the gap in the conductive feature.

9. The method of claim 8, wherein the conductive contact contacts the sidewall of the first dielectric feature.

10. A method of forming a semiconductor arrangement, comprising:
    forming a plurality of layers over a substrate;
    forming an opening in the plurality of layers to expose the substrate;
    forming a dielectric feature in the opening;
    doping a portion of the substrate through the opening after forming the dielectric feature to define a first doped region in the substrate;

forming conductive material in the opening after doping the portion of the substrate;

recessing the conductive material; and doping a portion of the conductive material after recessing the conductive material to define a second doped region in the conductive material.

11. The method of claim 10, wherein:

forming the conductive material comprises forming the conductive material to define a gap surrounded by the conductive material, and the gap is disposed between the first doped region and the second doped region.

12. The method of claim 10, wherein:

the plurality of layers comprises a semiconductive layer, a shallow trench isolation (STI) region over the semiconductive layer, and a dielectric layer over the semiconductive layer, and forming the opening comprises forming the opening through the STI region and the semiconductive layer, wherein the dielectric layer is separated from the opening by the STI region.

13. The method of claim 12, wherein a portion of the semiconductive layer is separated from the opening by the STI region.

14. The method of claim 10, wherein:

the plurality of layers comprises a shallow trench isolation (STI) region, and doping the portion of the conductive material after recessing the conductive material to define the second doped region comprises doping the portion of the conductive material at a location laterally co-planar with the STI region.

15. The method of claim 10, comprising:

forming a conductive contact after doping the portion of the conductive material to define the second doped region.

16. The method of claim 10, wherein recessing the conductive material comprises recessing the conductive material to expose the dielectric feature.

17. A method of forming a semiconductor arrangement, comprising:

forming a plurality of layers over a substrate;

forming an opening in the plurality of layers to expose the substrate;

forming a dielectric feature in the opening;

doping a portion of the substrate through the opening after forming the dielectric feature to define a first doped region in the substrate;

forming conductive material in the opening after doping the portion of the substrate, wherein forming the conductive material comprises forming the conductive material to define a gap surrounded by the conductive material; and doping a portion of the conductive material to define a second doped region in the conductive material, wherein the gap is disposed between the first doped region and the second doped region.

18. The method of claim 17, wherein:

the plurality of layers comprises a semiconductive layer, a shallow trench isolation (STI) region over the semiconductive layer, and a dielectric layer over the semiconductive layer, and forming the opening comprises forming the opening through the STI region and the semiconductive layer, wherein the dielectric layer is separated from the opening by the STI region.

19. The method of claim 18, wherein a portion of the semiconductive layer is separated from the opening by the STI region.

20. The method of claim 17, wherein:

the plurality of layers comprises a shallow trench isolation (STI) region, and doping the portion of the conductive material to define the second doped region comprises doping the portion of the conductive material at a location laterally co-planar with the STI region.

* * * * *